United States Patent
Chadwick et al.

(10) Patent No.: US 9,437,670 B2
(45) Date of Patent: Sep. 6, 2016

(54) LIGHT ACTIVATED TEST CONNECTIONS

(71) Applicant: INTERNATIONAL BUSINESS MACHINES CORPORATION, Armonk, NY (US)

(72) Inventors: Nathaniel R. Chadwick, Burlington, VT (US); John B. DeForge, Barre, VT (US); John J. Ellis-Monaghan, Grand Isle, VT (US); Jeffrey P. Gambino, Westford, VT (US); Ezra D. Hall, Richmond, VT (US); Marc D. Knox, Hinesburg, VT (US); Kirk D. Peterson, Jericho, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 535 days.

(21) Appl. No.: 13/689,090

(22) Filed: Nov. 29, 2012

(65) Prior Publication Data

US 2014/0145747 A1    May 29, 2014

(51) Int. Cl.
| | |
|---|---|
| *G01R 31/02* | (2006.01) |
| *H01L 29/00* | (2006.01) |
| *H01L 21/66* | (2006.01) |
| *G01R 31/28* | (2006.01) |

(52) U.S. Cl.
CPC ........... *H01L 29/00* (2013.01); *G01R 31/2856* (2013.01); *H01L 22/34* (2013.01); *G01R 31/2818* (2013.01); *H01L 2924/0002* (2013.01)

(58) Field of Classification Search
CPC .......... H01R 13/6641; H01R 13/6683; H01R 13/70; H01R 13/71; G01R 31/2884; G01R 31/31728; G01R 31/318511; G01R 31/311
See application file for complete search history.

(56) References Cited

U.S. PATENT DOCUMENTS

| | | |
|---|---|---|
| 5,161,159 A | 11/1992 | McClure et al. |
| 6,560,149 B2 | 5/2003 | Muller |
| 6,815,973 B1* | 11/2004 | Conn .................. 324/750.3 |
| 7,184,340 B2 | 2/2007 | Lim |
| 7,573,763 B2 | 8/2009 | Im et al. |
| 7,875,854 B2 | 1/2011 | Cannon et al. |
| 2004/0201287 A1 | 10/2004 | Kagermeier et al. |
| 2011/0037107 A1 | 2/2011 | Potok et al. |
| 2011/0102011 A1* | 5/2011 | Van Der Plas et al. . 324/762.03 |
| 2012/0026817 A1 | 2/2012 | Stewart |
| 2012/0098029 A1 | 4/2012 | Mazumder |
| 2012/0126844 A1* | 5/2012 | Yasuta et al. ............ 324/756.07 |
| 2013/0027051 A1* | 1/2013 | Ouyang et al. ............... 324/501 |

OTHER PUBLICATIONS

Wang et al., "Ge-Photodetectors for Si-Based Optoelectronic Integration", Sensors 2011, Jan. 2011, pp. 696-718.

Xu et al., "Developement of Flip-Chip Interconnections of Photodetector Readout Circuit (ROIC)", 2010 11th International Conference on Electronic Packaging Technology & High Density Packaging (ICEPT-HDP), Aug. 2012, pp. 31-33.

(Continued)

*Primary Examiner* — Tung X Nguyen

(74) *Attorney, Agent, or Firm* — David Cain; Andrew M. Calderon; Roberts Mlotkowski Safran Cole & Calderon, P.C.

(57) ABSTRACT

A test circuit including a light activated test connection in a semiconductor device is provided. The light activated test connection is electrically conductive during a test of the semiconductor device and is electrically non-conductive after the test.

17 Claims, 13 Drawing Sheets

(56) References Cited

OTHER PUBLICATIONS

Thacker et al., "Wafer-Testing of Optoelectronic-Gigascale CMOS Integrated Circuits", IEEE Journal of Selected Topics in Quantum Electronics No. 17, vol. 3, 2011, pp. 659-670.

Wang, "Research progress on a novel conductive polymer—poly(3,4-ethylenedioxythiophene) (PEDOT)", Journal of Physics: Conference Series 152 (2009) 012023, IOP Science, 2009, pp. 1-10.

"Principles of Photovoltaics, Photovoltaic Materials/ Solar Energy", Green Rhino Energy, http://www.greenrhinoenergy.com/solar/technologies/pv_cells.php, Accessed Nov. 8, 2012; 2 pages.

Koester et al., "Germanium-on-SOI Infrared Detectors for Integrated Photonic Applications," IEEE Journal of Selected Topics in Quantum Electronics, vol. 12, No. 6, pp. 1489-1502, Nov.-Dec. 2006.

* cited by examiner

LIGHT ACTIVATED TEST CONNECTIONS

FIELD OF THE INVENTION

The invention relates to semiconductor structures and methods of manufacture and, more particularly, to light activated test connections in integrated circuits and methods of manufacture.

BACKGROUND

Testing of an integrated circuit (IC) chip is often limited by the function the chip is designed to perform during functional operation. This is especially true in the testing of unassembled chips of a three dimensional (3D) stacked chip system where the test is being performed on a circuit that is only partially complete, i.e., is not a fully integrated circuit. For example, a circuit in a 3D stacked chip system often traverses the interface between chips. These circuits are incomplete when the individual chips are unassembled, e.g., prior to connecting the chips to one another in a stack, such that testing is typically done only after assembling the chips are assembled in the stack. This practice, however, leads to higher yield loss since one faulty chip in an assembled chip stack may cause other good chips in the chip stack to be discarded. Additionally, testing of multiple devices requires individual connection with each device (e.g., chip, 3D assembly), requiring more fully integrated devices, and the time/cost associated with connecting to each device Chip to chip stacking (e.g., stacked chip systems, 3D technology, etc.) utilizes through-silicon vias (TSVs), which are electrical contacts that extend through a substrate (e.g., silicon) and permit electrical connection from one side of the substrate to the other. Chip to chip stacking also utilizes Inner Stratum Input Output (ISIO), which are chip to chip connections. Chip to chip stacking also introduces the drive to provide Known Good Die (KGD) to the chip stack for the yield loss reason already described, and this drives performing as much testing on individual die (e.g., chips) as soon as possible in the manufacturing process which, in turn, increases wafer testing requirements to achieve KGD goals.

Interconnect and TSV density is trending in a direction that makes it more difficult to support KGD requirements of 3D technology. For example, the density of interconnects and TSVs (e.g., the number of elements per die area) can increase by sixteen-fold (16×) over the span of 2 to 3 years. This constant increase in interconnect and TSV density makes it increasingly difficult to perform wafer probe tests, and wafer probing of the ever-increasing number of elements may become untenable.

Manufacturing issues are also introduced by the inability to fully test a TSV with single sided wafer probing. Probe and equipment limitations do not support interconnect density scaling factors, and the constant scaling of these elements represents a technical challenge that may become cost prohibitive. ISIO testing is also difficult in that there is no access to ISIO instances off-chip for testability until the individual chips are assembled into stacks. Increasing instance counts and lower fault coverage of instances results in increasing fault occurrences, which results in increasing yield impacts. Without a mode for rework of assembled chip stacks, the delaying of TSV testing until package testing (e.g., after chip stack assembly) results in higher yield loss due to compounding of yield loss in multi-chip packaging.

Accordingly, there exists a need in the art to overcome the deficiencies and limitations described hereinabove.

SUMMARY

In a first aspect of the invention, there is a semiconductor structure that includes a test circuit comprising a light activated test connection in a semiconductor device. The light activated test connection is electrically conductive during a test of the semiconductor device and is electrically non-conductive after the test.

In another aspect of the invention, there is a method of testing an integrated circuit chip. The method includes: closing a test circuit in the chip by applying light to a light activated test connection in the chip; applying a test signal to the test circuit while the test circuit is closed; and opening the test circuit by removing the light from the light activated test connection in the chip after the applying the test signal.

In another aspect of the invention, a method of forming a semiconductor structure includes: forming a first conductive path in a substrate; forming a second conductive path in a substrate; and forming a barrier layer over a substrate. The method also includes patterning the barrier layer to form a first opening over the first conductive path and a second opening over the second conductive path. The method further includes: forming a first conductive pad in the first opening and contacting the first conductive path; and forming a second conductive pad in the second opening and contacting the second conductive path. The method additionally includes: forming a light activated test connection contacting the first conductive pad and the second conductive pad; and forming a passivation layer on the barrier layer, the first conductive pad, and the second conductive pad.

In yet another aspect of the invention, there is a wafer testing system for testing a chip in a wafer. The system includes a handler wafer connected to the wafer, wherein the chip includes a test circuit with a light activated test connection. The system also includes test hardware connected to electrical connections of the chip. The system further includes a light source that selectively activates the light activated test connection during a wafer test by applying light to the light activated test connection.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a test circuit including a light activated test connection which comprises the structures of the present invention. In still further embodiments, a method in a computer-aided design system is provided for generating a functional design model of the test circuit including a light activated test connection. The method comprises generating a functional representation of the structural elements of the test circuit including a light activated test connection.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention semiconductor structures and methods of manufacture and, more particularly, to light activated test connections in integrated circuits and methods of manufacture. According to aspects of the invention, light activated test connections provide conductive test pathways for testing of a semiconductor structure during manufacture. In embodiments, the light activated test connections comprise a material that is selectively converted from an essentially non-conductive state to a conductive state through the application of light. Embodiments include a photo detector for testing interconnect circuit implementation using light activated test connections which are activated during the test mode by a light source and then inactive after testing. In this manner, implementations of the invention provide the ability to test TSVs and related ISIO circuit elements using single sided wafer probing in a chip prior to the chip being assembled in a chip stack.

Figure 1:
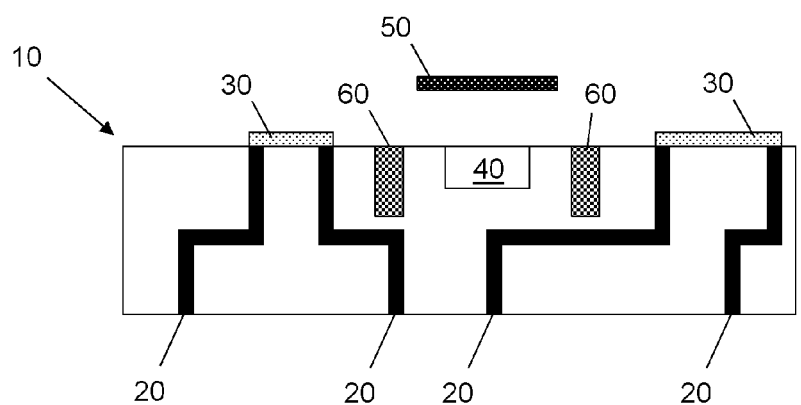
FIG. 1 shows a semiconductor structure in accordance with aspects of the invention.

FIG. 1 shows a device that includes a semiconductor structure 10 having electrically conductive paths 20 formed therein. In accordance with aspects of the invention, certain ones of the electrically conductive paths 20 are connected to each other by light activated test connections 30. In embodiments, the light activated test connections 30 are composed of a material that is normally an electrical insulator but which converts to an electrical conductor when illuminated (e.g., impinged on) by light having a particular wavelength (or energy). When light having the particular wavelength (or energy) is applied to the material of the light activated test connections 30, it causes electrons in the material to jump levels and become charge carries, e.g., the photoelectric effect. In this manner, the light activated test connections 30 operate as an electrical switch that is turned on and off using light. It is noted that the particular wavelength of light may also be expressed as a particular energy using the Planck relation.

In embodiments, the light activated test connections 30 are structured and arranged to selectively supply conductive pathways only during testing of the semiconductor structure 10, e.g., during manufacture, and to remain non-conductive during normal operation of the semiconductor structure 10 after packaging. For example, the semiconductor structure 10 may comprise a chip and the light activated test connections 30 may be arranged at locations in the chip that can be selectively exposed to light during testing of the chip prior to being covered with another chip or a package lid, but which locations are shielded from light after packaging of the chip, e.g., in a 3D stacked chip system and/or a chip package. In further embodiments, the light activated test connections 30 are sacrificial, e.g. used for temporary connection prior to subsequent dicing and/or other 3D assembly steps.

Still referring to FIG. 1, the semiconductor structure 10 may comprise any suitable structure in which selective activation of test circuits is desired, including but not limited to: a conventional CMOS wafer, a through-silicon-via (TSV) wafer, a printed circuit board (PCB), etc. For example, the semiconductor structure 10 may comprise a substrate, such as a bulk silicon substrate, silicon-on-insulator (SOI) substrate, glass substrate, etc. One or more wiring levels comprising one or more interlevel dielectric (ILD) layers may be formed on the substrate using conventional semiconductor fabrication techniques. The electrically conductive paths 20 may include any suitable metallization, such as wires, interconnects, vias, through-silicon-vias, etc., formed in the substrate and/or the one or more ILD layers using conventional semiconductor fabrication techniques.

With continued reference to FIG. 1, the light activated test connections 30 may be formed in or on a silicon-based portion of the semiconductor structure 10 adjacent to one or more silicon-based devices 40 that are also formed in or on the same portion of the semiconductor structure 10. For example, the light activated test connections 30 and a silicon-based device 40, such as a field effect transistor (FET), may be formed in an active region of a bulk silicon substrate or an active layer of an SOI substrate. In such situations, implementations of the invention are structured and arranged to avoid unwanted activation of silicon-based devices 40 when selectively activating the light activated test connections 30, e.g., when applying light to the light activated test connections 30. In accordance with aspects of the invention, unwanted activation of such silicon based devices 40 is accomplished through at least one of: choice of material of the light activated test connections 30; choice of light source for activating the light activated test connections 30; and shielding of the silicon based devices 40.

In embodiments, the light activated test connections 30 are composed of a material having a band gap substantially less than that of silicon, and the light used to activate the light activated test connections 30 is chosen such that it has an energy that is sufficient to activate the light activated test connections 30 but insufficient to activate the silicon (Si). For example, the light activated test connections 30 may be composed of germanium (Ge) which has a band gap of about 0.7 eV, and a light source that emits light having an energy of about 0.9 eV is used to selectively activate the light activated test connections 30. On the one hand, the 0.9 eV light is sufficient to activate the Ge because its energy is greater than the 0.7 eV band gap of Ge. On the other hand, the 0.9 eV light is not sufficient to activate the Si because its energy is less than the 1.1 eV band gap of Si. Stated differently, Ge absorbs light at this wavelength while Si does not, and this permits selectively activating the Ge based light activated test connections 30 without activating the silicon based device 40. In a non-limiting exemplary embodiment, the light activated test connection 30 may be composed of Ge that is between about 0.1 μm and about 1.0 μm thick (e.g., in a vertical direction of the chip), and the light used for activating the light activated test connection 30 may have a wavelength of about 1350 nm.

In other embodiments, the light activated test connections 30 are composed of a material having a band gap substantially greater than that of silicon, and the light used to activate the light activated test connections 30 is chosen such that it has an energy that is sufficient to activate the light activated test connections 30 and is also limited in area of exposure. For example, the light activated test connections 30 may be composed of poly(3,4-ethylenedioxythiophene) (PEDOT), cadmium telluride, aluminum antimonide, or any other material having a band gap of about 1.6 eV, and the light used to selectively activate the light activated test connections 30 may be green light, e.g., a green laser. When illuminated with green light, the conductivity of the light activated test connections 30 switches from extremely low to proportional to the intensity of the green light. More specifically, the conductivity may be expressed as conductivity=q*u*n, where "q" is the charge on an electron, "u" is the mobility, and "n" is the number of charge carriers. Since the mobility is a bulk property of the material and the value of "n" is generated by the laser light, the conductivity of the material is set by, e.g., proportional to, the incident laser illumination.

In additional embodiments, the light activated test connections 30 are composed of any desired material having a bandgap between about 0.7 eV and about 2.0 eV, and the silicon devices 40 are shielded from the light that is used to selectively activate the light activated test connections 30. For example, the light activated test connections 30 may be composed of any material, including materials having a band gap similar to that of silicon. In these embodiments, activation of the silicon devices 40 is avoided by shielding the silicon devices 40 from the light using opaque structures 50 as shown in FIG. 1. The opaque structures 50 may be formed in wiring levels over the silicon devices 40, and may be composed of, for example, metallization, carbon black impregnated photoresist, or any other opaque material.

Additionally or alternatively, the silicon devices 40 may be electrically isolated from the silicon contacting the light activated test connections 30. For example, isolation structures 60, such as shallow trench isolation structures (STI), may be formed in the semiconductor structure 10 between the light activated test connections 30 and the silicon devices 40. In this manner, activation of the silicon devices 40 may be avoided when light is applied to the light activated test connections 30.

Figure 2:
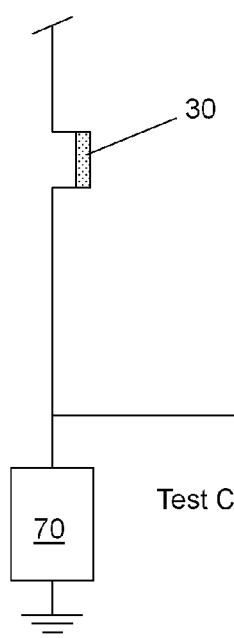
FIG. 2 shows an exemplary test control circuit in accordance with aspects of the invention.

FIG. 2 shows an exemplary test control circuit in accordance with aspects of the invention. As depicted in FIG. 2, a light activated test connection 30 and a current source 70 are connected to one input of a gate 80 (e.g., logic functioning as an AND gate). A test control signal is connected to the other input of the gate 80. An output of the gate 80 is a test control enable signal. During normal operation, i.e., when an activating light is not applied to the light activated test connection 30, the light activated test connection 30 is essentially non-conductive (other than negligible leakage) such that the output of the gate 80 is a first state. During testing, i.e., when an activating light is applied to the light activated test connection 30, the light activated test connection 30 is conductive, which causes the output of the gate 80 to change to a second state, e.g., to enable the remainder of a test circuit.

Still referring to FIG. 2, the current source 70 may be sized based on the leakage of the light activated test connection 30 and the threshold of the gate 80. For example, a Ge-based light activated test connection 30 may be structured and arranged to behave with similar light response and off leakage as a reverse bias p-n diode. In one exemplary implementation, the current source 70 is about 500 μa, and the Ge-based light activated test connection 30 has an about $1 \times 10^{-8}$ amp leakage current at a bias voltage of about 1 V when not illuminated by light and a greater than $1 \times 10^{-5}$ amp current when illuminated by an infrared light of sufficient power. The invention is not limited to this example, and other configurations may be used.

Figure 3:
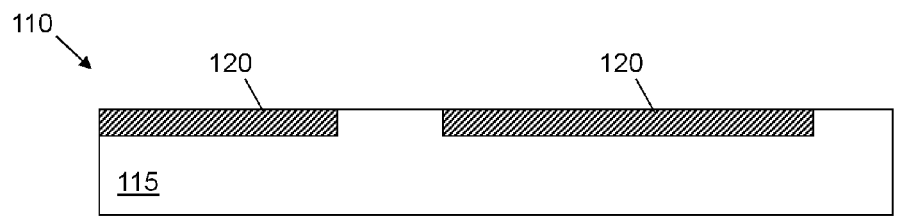
FIGS. 3-9 show semiconductor structures and respective manufacturing steps in accordance with aspects of the invention.

FIGS. 3-9 show processing steps and respective structures in accordance with aspects of the invention. In particular, FIG. 3 shows a cross section of a portion of a semiconductor structure, e.g., an integrated circuit chip 110 comprising a substrate 115 and conductive paths 120 at a top surface of the substrate 115. The conductive paths 120 may comprise any conventional metallization, including but not limited to wires, interconnects, vias, through silicon vias, etc., e.g., similar to conductive paths 20 already described herein. The conductive paths 120 may be formed, for example, at the top surface of a bulk substrate, in the active region of an SOI substrate, or in a wiring level (e.g., ILD layer) over either a bulk or SOI substrate. The conductive paths 120 may be connected to other logic and/or devices in the chip 110, such as test logic and/or test circuitry as described herein.

Figure 4:
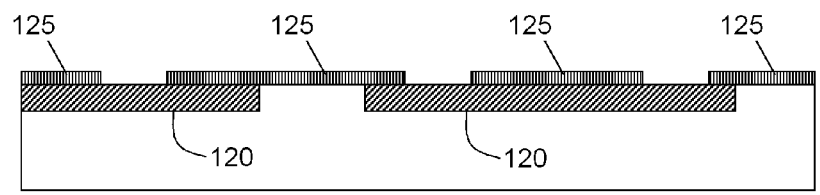

As shown in FIG. 4, a patterned barrier layer 125 is formed on the top surface of the substrate 115. The barrier layer 125 may comprise, for example, a plurality of layers of dielectric material including, but not limited to, a three layer stack comprising a first layer of silicon nitride, a second layer of silicon oxide, and a third layer of silicon nitride. The barrier layer 125, whether a single layer or plural layers, may be formed on the top surface of the substrate 115 using conventional semiconductor materials and manufacturing processes. For example, the barrier layer 125 may be formed by depositing a conformal layer of silicon nitride, e.g., using chemical vapor deposition (CVD). After deposition, the barrier layer 125 may be patterned in any suitable manner, such as photolithographic masking and etching processes. For example, a photomask may be provided by forming a layer of photoresist material on the barrier layer 125, exposing the photoresist material to a pattern of light, and developing the exposed photoresist material. An etching process, such as a reactive ion etch (RIE), may then be used to form patterns (e.g., openings) in the barrier layer 125 by removing portions of the barrier layer 125 that are not covered by the photomask. After etching, the photomask may be removed using a conventional ashing or stripping process.

Figure 5:
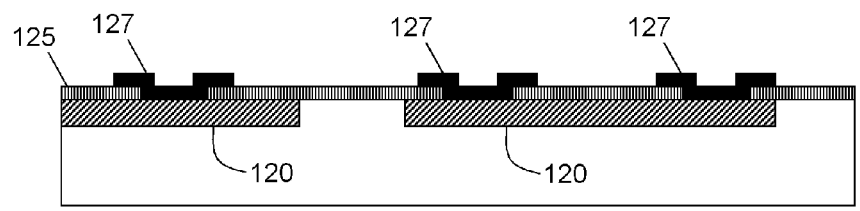

As shown in FIG. 5, contact pads 127 are formed in openings of the patterned barrier layer 125. The contact pads 127 may comprise any electrically conductive material including materials that are used in forming wire bond pads, such as aluminum. The contact pads 127 may be formed using any suitable processes, including, but not limited to conformally depositing a layer of material (e.g., by CVD, sputtering, etc.), and patterning the layer using photolithographic masking and etching. In embodiments, each one of the contact pads 127 directly contacts one of the conductive paths 120 through an opening in the barrier layer 125.

Figure 6:
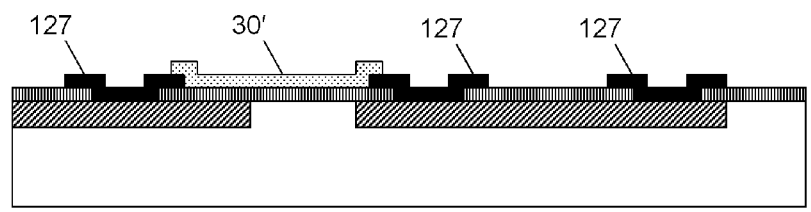

As shown in FIG. 6, a light activated test connection 30' is formed between two of the contact pads 127. The light activated test connection 30' may be formed in a manner similar to the contact pads 127, e.g., by forming a conformal layer of conductive material and then patterning the conformal layer using photolithographic masking and etching. The light activated test connection 30' may be composed of materials such as those described with respect to FIG. 1, e.g., Ge.

Figure 7:
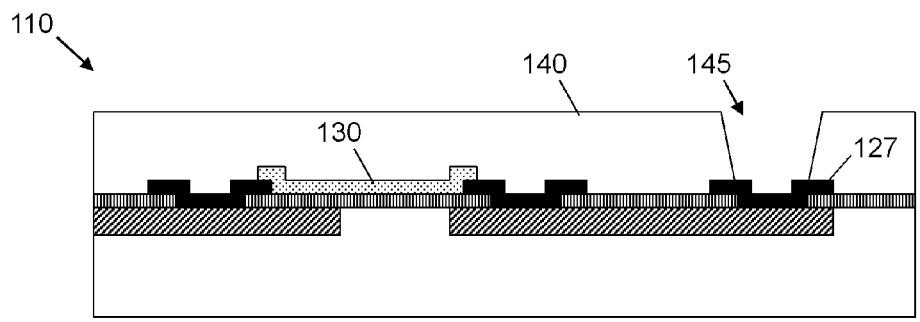

FIG. 7 shows the formation of a patterned passivation layer 140 atop the structure. The passivation layer 140 may be composed of any suitable material and formed using conventional semiconductor manufacturing processes. For example, the passivation layer 140 may comprise photosensitive polyimide (PSPI) that is applied with a spin-on process. Openings 145 may be formed in the passivation layer over one or more of the contact pads 127 by exposing, developing, and curing the PSPI in a conventional manner.

In embodiments, the material and thickness of the passivation layer 140 are selected such that light may be transmitted through the passivation layer 140 for activating the light activated test connection 30', e.g., as described with respect to FIGS. 1 and 2. In accordance with aspects of the invention, the chip 110 may thus be tested by applying a predetermined light to the light activated test connection 30', which completes a test circuit in the chip 110. After testing, the exposed contact pad 127 may be used to connect the chip 110 to another device, e.g., another chip in a 3D stacked chip assembly.

Figure 8:
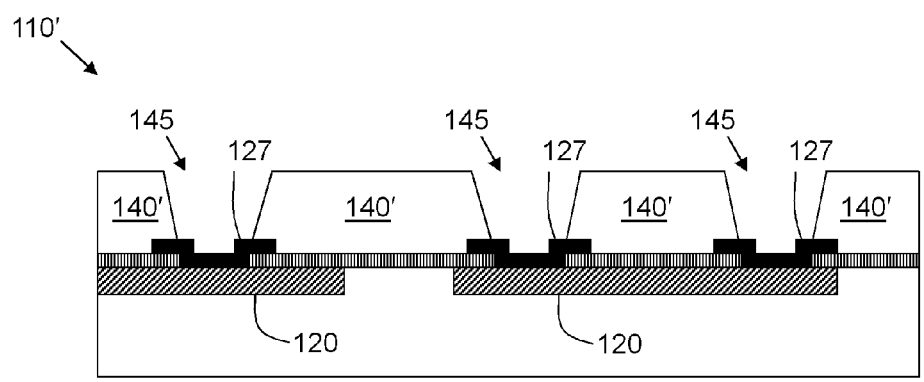
Figure 9:
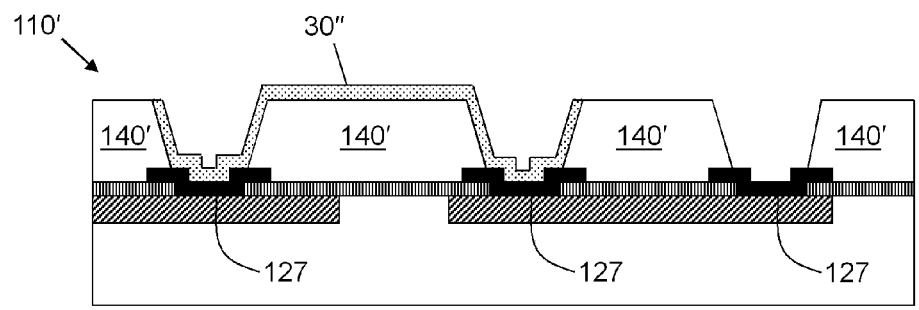

FIGS. 8 and 9 depict another embodiment of the chip 110' in accordance with aspects of the invention. In particular, FIG. 8 shows a passivation layer 140' formed on the structure of FIG. 5 with openings 145' formed over each of the contact pads 127. The passivation layer 140' and openings 145' may be formed using the same processes and materials described with respect to FIG. 7.

As shown in FIG. 9, a light activated test connection 30'' is formed on the passivation layer 140' and contacting at least two of the contact pads 127 through the openings 145'. The light activated test connection 30'' may be formed using the same processes and materials described with respect to FIG. 6. In accordance with aspects of the invention, the chip 110' may be tested by applying a predetermined light to the light activated test connection 30'', which completes a test circuit in the chip 110'. After testing, one or more exposed contact pads 127 may be used to connect the chip 110' to another device, e.g., another chip in a 3D stacked chip assembly.

Figure 10:
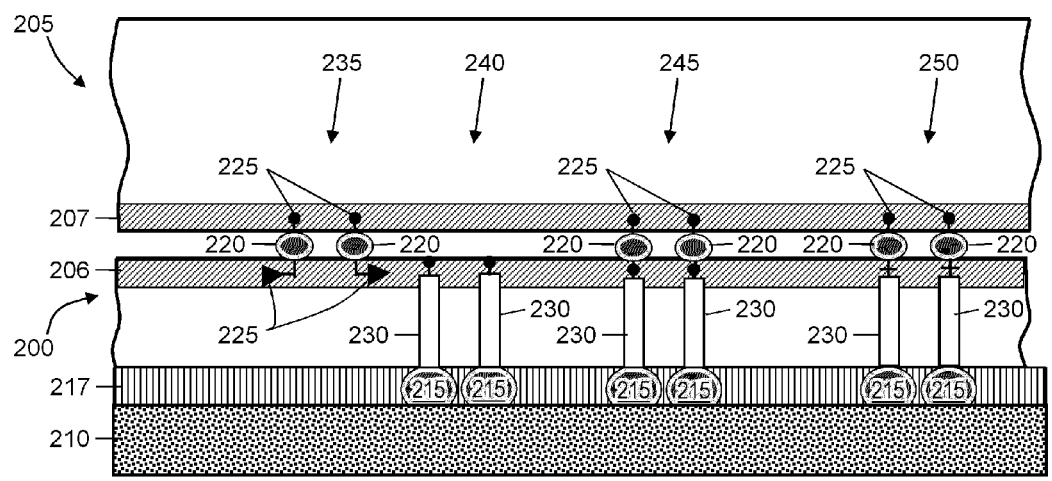
FIG. 10 shows a 3D stacked chip package.

FIG. 10 shows a bottom chip 200 and a top chip 205 connected to one another in a 3D stacked chip system. The bottom chip 200 has an active region 206 and the top chip 205 has an active region 207, e.g., where IC devices are formed in the chips. The bottom chip 200 is connected to a package substrate 210 by electrical connections 215, such as controlled collapse chip connection (C4) bumps. An underfill material 217 may be provided in the space between the bottom chip 200 and the package substrate 210. The chips 200 and 205 may be connected by electrical connections 220, such as micro C4 bumps, which may provide communication pathways between the chips 200 and 205.

The chips 200 and 205 may be provided with various circuitry and devices, including but not limited to: devices 225, TSVs 230, etc. Some ISIO, such as that shown at 235, are not connected to a TSV, but rather only connect one or more devices 225 in the bottom chip 200 to one or more devices 225 in the top chip 205. As shown at 240, some TSVs 230 connect to devices 225 only in the bottom chip 200, without connecting to devices in the top chip 205. As shown at 245, some TSVs 230 connect to devices 225 in both the bottom chip 200 and the top chip 205. As shown at 250, some TSVs 230 connect to devices 225 only in the top chip 205, without connecting to devices in the top chip 200.

Figure 11:
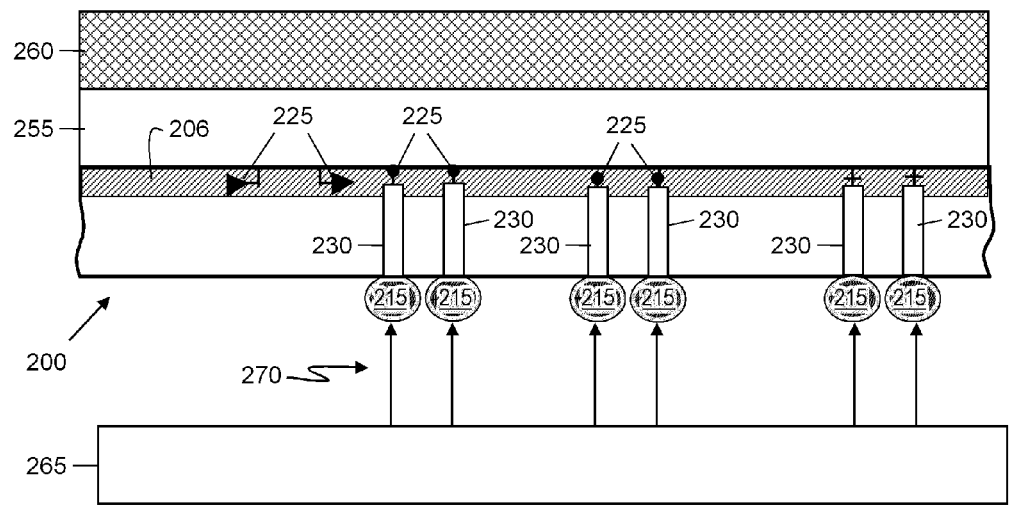
FIG. 11 shows a wafer test arrangement for a single die prior to being connected in a chip stack.

FIG. 11 shows a wafer testing arrangement of the bottom chip 200 before it is connected to the top chip 205 as shown in FIG. 10. Like reference numbers refer to like elements. In the wafer testing arrangement depicted in FIG. 11, the bottom chip 200 is connected to a handler wafer 255 (e.g., a glass handler wafer), which is in turn connected to a wafer prober chuck 260. Testing hardware 265, such as a wafer probe card or similar test interface structure, is placed in electrical communication with the C4 connections 215 by a plurality of wafer probes 270 (e.g., needles, pins, cantilever probes, buckling beam probes, etc.). In the wafer testing arrangement shown in FIG. 11, many of the electrical connection paths of the stacked integrated circuit (e.g., as shown in FIG. 10) are not yet complete since these connection paths are provided by the top chip, which is not yet connected to the bottom chip 200. As such, there is no way to fully test all of the TSVs 230 and no way to fully test all of the ISIO.

Figure 12:
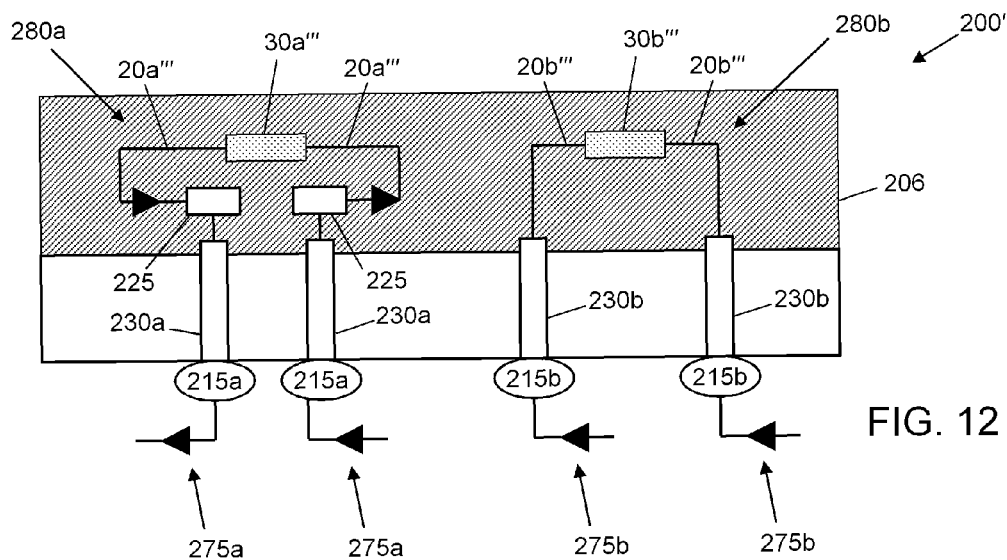
FIG. 12 shows a semiconductor structure in accordance with aspects of the invention.

FIGS. 12-20 show arrangements for wafer testing a single chip of a 3D stacked chip system prior to assembly in the 3D stacked chip system, in accordance with aspects of the invention. More specifically, FIG. 12 shows a chip 200' (still in wafer form) having an active region 206, C4 connections 215a and 215b at a bottom side of the substrate, and TSVs 230a and 230b connected to the C4 connections and passing through the substrate and into the active region 206. According to aspects of the invention, light activated test connections 30a''' and 30b''' and associated conductive pathways 20a''' and 20b''' are provided between certain ones of the TSVs 230a and 230b in order to provide a light activated test connection path between the particular TSVs 230a and 230b. Test hardware 275a and 275b may be connected to the respective C4 connections 215a and 215b, e.g., by wafer probes. In this manner, test circuits 280a and 280b may be provided for testing the TSVs 230a and 230b and other associated elements in the chip 200' prior to the chip 200' being assembled in a 3D chip stack.

As shown with TSVs 230a, in some instances there may be devices 225 (e.g., logic, diodes, gates, latches, etc.) in the light activated connection path between the TSVs 230a. In other instances, such as with TSVs 230b, there are no devices (e.g., logic, diodes, gates, latches, etc.) in the light activated connection path between the TSVs 230b. In embodiments, there is no design for test (DFT) area overhead added by the test circuits 280a and 280b.

Still referring to FIG. 12 and according to aspects of the invention, the light activated test connections 30a''' and 30b''' function as switches in the test circuits 280a and 280b. The light activated test connections 30a''' and 30b''' are non-conductive and thus provide an electrical discontinuity in the test circuits 280a and 280b when no light is shone on the light activated test connections 30a''' and 30b'''. On the other hand, the light activated test connections 30a''' and 30b''' are electrically conductive and thus complete the test circuits 280a and 280b when light is shone on the light activated test connections 30a''' and 30b''', e.g., as described above with respect to FIGS. 1 and 2. In this manner, implementations of the invention may be used to provide light activated test circuits for testing of a chip prior to assembly in a chip stack, which test circuits are inactive (e.g., inert) after the chip is assembled with another chip in the chip stack.

FIGS. 13-20 show various arrangements using the chip 200' having C4 connections 215a and 215b, TSVs 230a and 230b, and test circuits 280a and 280b with light activated test connections 30a''' and 30b''' according to aspects of the invention. As shown in FIGS. 13-20, the chip 200' may be connected to a handler wafer 255 and a prober chuck 260, e.g., as described above with respect to FIG. 11. Moreover, the chip 200' may be electrically connected to test equipment 275a and 275b, e.g., as described above with respect to FIG. 12.

Figure 13:
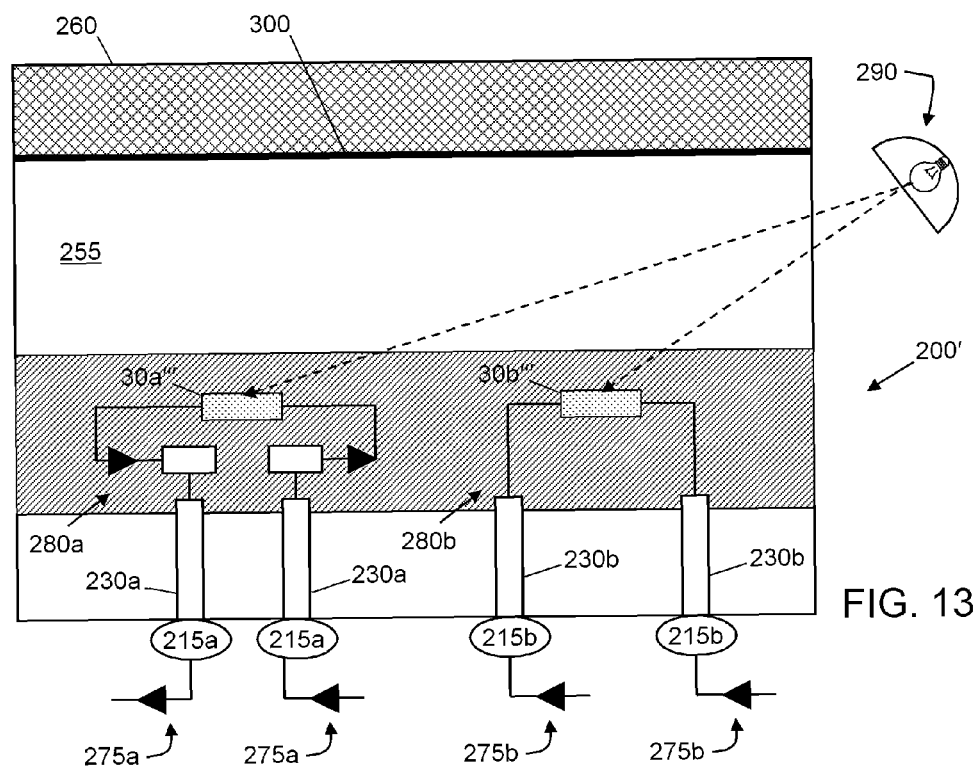
FIGS. 13-20 show wafer test arrangements in accordance with aspects of the invention.

Now referring specifically to FIG. 13, and in accordance with aspects of the invention, a light source 290 is provided and used to shine light on the light activated test connections 30a''' and 30b''' during wafer testing of the chip 200' before the chip 200' is assembled in a 3D chip stack. The light source 290 may be tuned to the material of the light activated test connections 30a''' and 30b''', e.g., as described with respect to FIGS. 1-2. In embodiments, the light source 290, the material of the handler wafer 255, and the material of the light activated test connections 30a''' and 30b''' are selected such that the light from the light source 290 transmits through the handler wafer 255 and impinges on the light activated test connections 30a''' and 30b''' with sufficient energy to convert the light activated test connections 30a''' and 30b''' from a non-conductive to a conductive state. For example, the handler wafer 255 may be glass, the light source 290 may emit light having a wavelength of about 1350 nm (e.g., near infrared (IR)), and the light activated test connections 30a''' and 30b''' may be composed of Ge that is between about 0.1 µm and about 1.0 µm thick in a vertical direction of the chip. The invention is not limited to this example, however, and other wavelengths and other materials may be used within the scope of the invention.

According to aspects of the invention, a method of testing the chip 200' may include: closing the test circuit 280b by applying light to a light activated test connection 30b''' using the light source 290; applying a test signal to the test circuit 280b via the test hardware 275b while the test circuit 280b is closed; and opening the test circuit 280b by removing the light from the light activated test connection 30b''' after the applying the test signal.

Still referring to FIG. 13, the light source 290 introduces light to the chip 200' from a side edge of the wafer. A reflective material 300 may be provided at the interface between the handler wafer 255 and the prober chuck 260. The reflective material 300 may be used to reflect stray light from the light source 290 toward the light activated test connections 30a''' and 30b'''. The reflective material 300 may be provided as a coating on the surface of the prober chuck 260. The prober chuck 260 may be made of any suitable conventional materials, such as metal or polymer.

Figure 14:
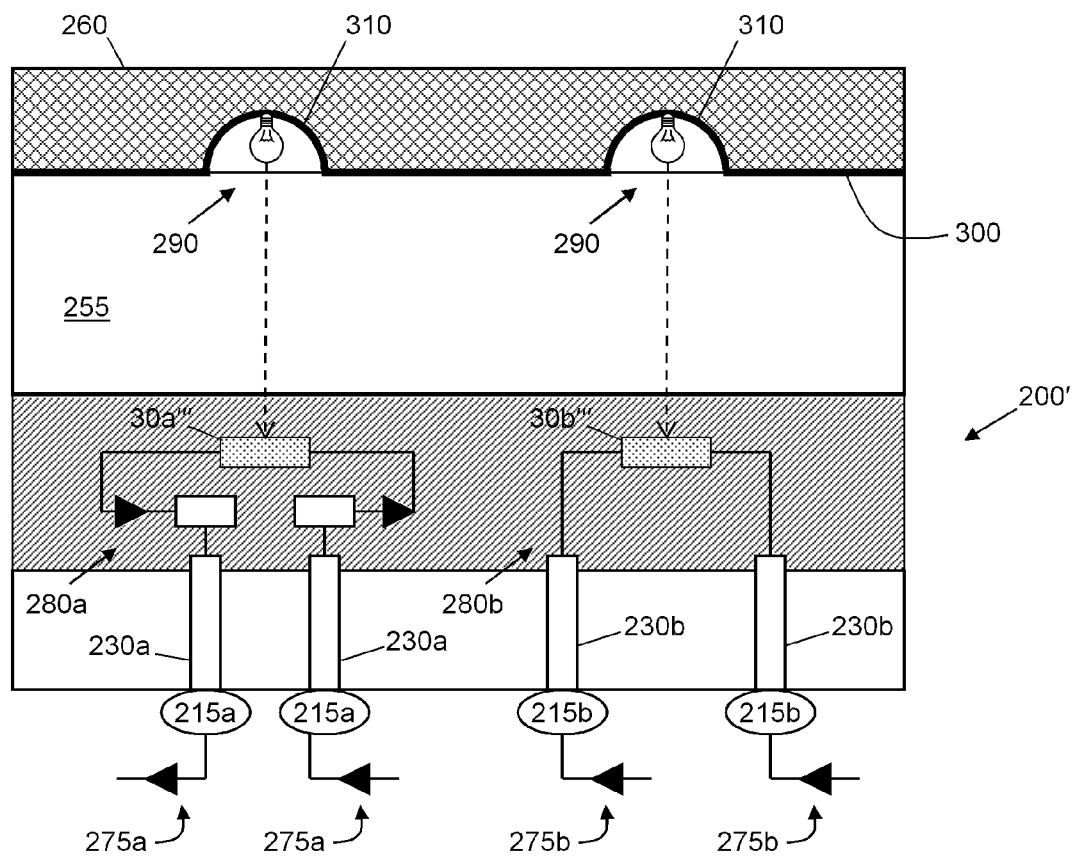

FIG. 14 shows an arrangement in accordance with aspects of the invention in which the light source 290 is embedded in the prober chuck 260. For example, the light source may comprise light emitting elements (e.g., near IR emitter, light emitting diode (LED), etc.) located in cavities 310 and 310 in the prober chuck 260. In this arrangement, the light source 290 may be located in closer proximity to the light activated test connections 30a''' and 30b''', without being introduced from the side edge of the wafer as shown in FIG. 13. As with FIG. 13, the light source 290, the material of the handler wafer 255, and the material of the light activated test connections 30a''' and 30b''' in FIG. 14 may be selected such that the light from the light source 290 transmits through the handler wafer 255 and impinges on the light activated test connections 30a''' and 30b''' with sufficient energy to convert the light activated test connections 30a''' and 30b''' from a non-conductive to a conductive state.

Still referring to FIG. 14, the reflective coating 300 may be arranged on the interior of the cavities 310 to improve light delivery to the light activated test connections 30a''' and 30b'''. There may be any desired number of light sources 290 arranged at any desired locations in the prober chuck 260, and the number and/or location of the light sources 290 does not need to correspond exactly to the number and location of the light activated test connections 30a''' and 30b''' in the chip 200'.

Figure 15:
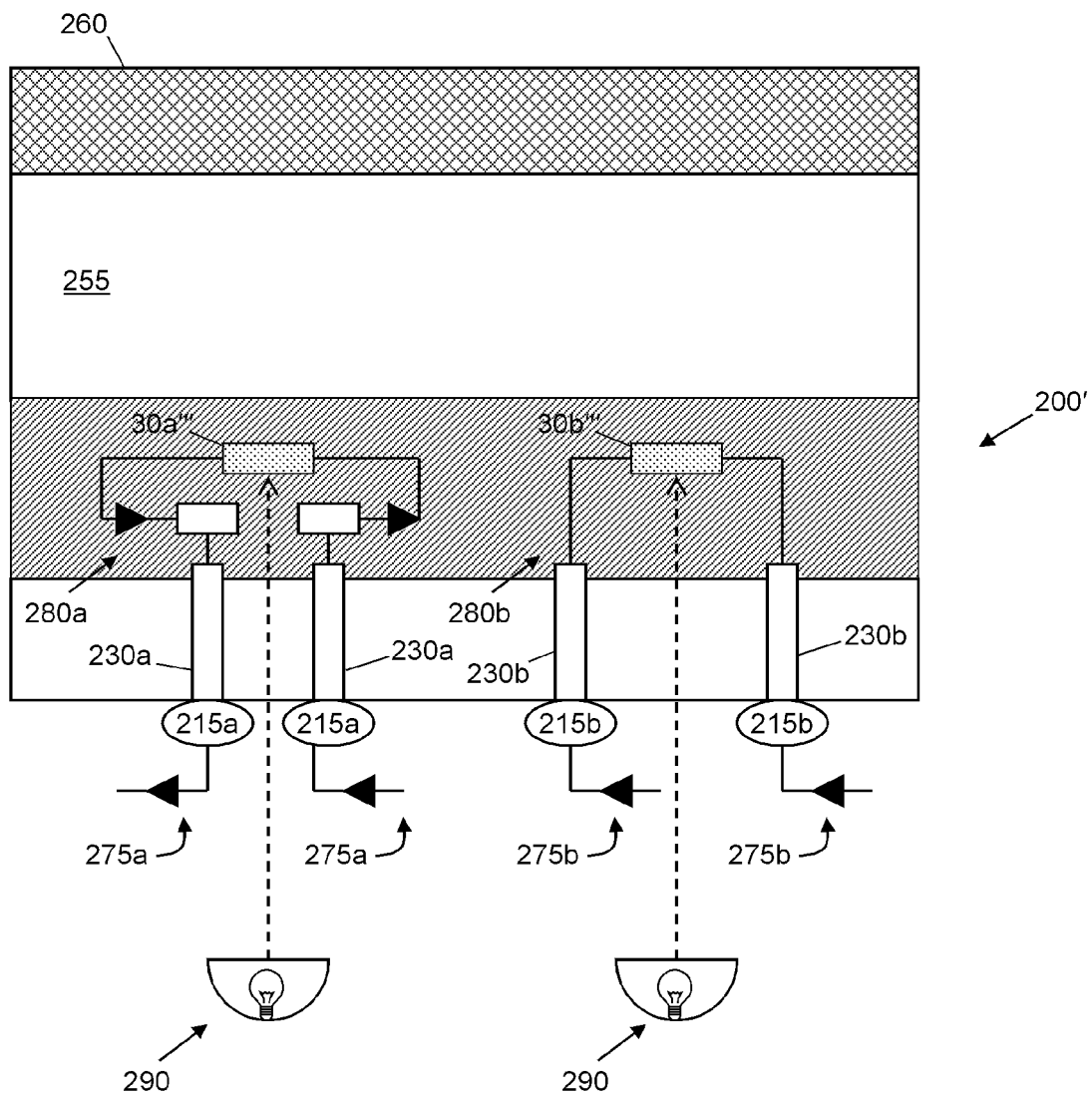

FIG. 15 shows an arrangement in accordance with aspects of the invention in which the light for activating the light activated test connections 30a''' and 30b''' is introduced from the bottom side of the chip 200'. In embodiments, the light source 290 is arranged at the bottom side of the chip 200' and the light travels through the substrate of the chip 200' before impinging on the light activated test connections 30a''' and 30b'''. In this implementation, the light source 290 and the material of the light activated test connections 30a''' and 30b''' are selected such that the light from the light source 290 transmits through the substrate of the chip 200' and impinges on the light activated test connections 30a''' and 30b''' with sufficient energy to convert the light activated test connections 30a''' and 30b''' from a non-conductive to a conductive state. Silicon is essentially infrared (IR) transparent, such that in an exemplary embodiment the chip 200' may comprise a silicon substrate, the light source 290 may emit IR light, and the light activated test connections 30a''' and 30b''' may be composed of Ge.

Figure 16:
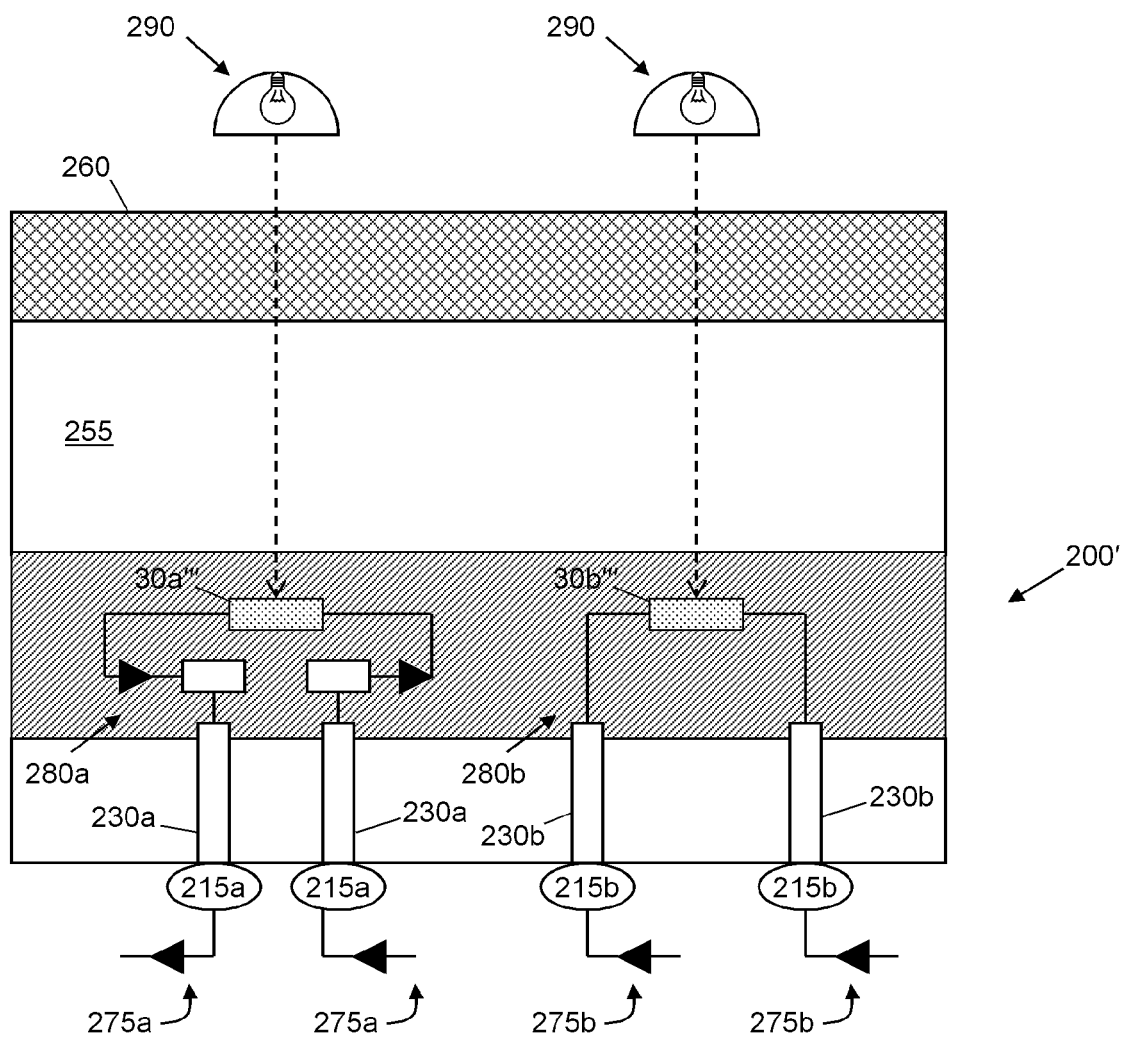

FIG. 16 shows an arrangement in accordance with aspects of the invention in which the light for activating the light activated test connections 30a''' and 30b''' is introduced from behind the prober chuck 260. In this embodiment, both the prober chuck 260 and the handler wafer 255 are composed of materials that are sufficiently transparent to the light of the light source 290, such that the light from the light source may transmit through the prober chuck 260 and the handler wafer 255 in order to convert the light activated test connections 30a''' and 30b''' from a non-conductive to a conductive state. For example, the handler wafer 255 may be composed of glass, and the prober chuck 260 may be composed of glass or polycarbonate or similar material. The implementation shown in FIG. 16 may be useful with low power testing (e.g., DC applications rather than AC applications) since the electrical conductivity of the light activated test connections 30a''' and 30b''' may be relatively low due attenuation of the light as it travels through both the prober chuck 260 and handler wafer 255.

Figure 17:
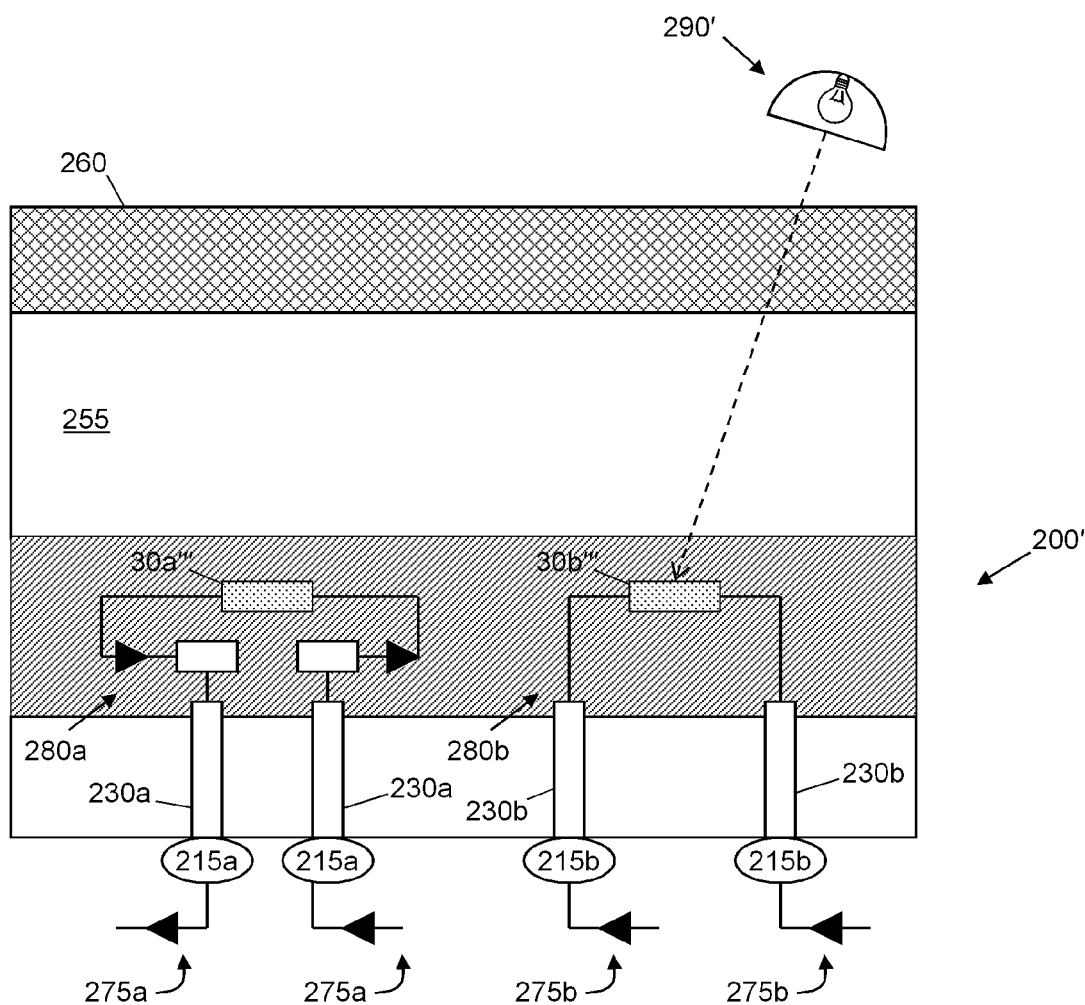

FIG. 17 also shows an arrangement in accordance with aspects of the invention in which the light for activating the light activated test connections 30a''' and 30b''' is introduced from behind the prober chuck 260. In the implementation shown in FIG. 17, the spatial position and aiming direction of the light source 290' may be controlled to provide highly selective activation of the light activated test connections 30a''' and 30b''. For example, the light source 290' may comprise a laser that can be moved relative to the chip 200' and aimed at a single one of the light activated test connections, e.g., 30b''', such that only one test connection is activated while other ones of the test connections are kept in the non-conducting state.

The movement and activation of the light source 290' may be controlled such that the light source 290' moves in a scanning pattern relative to the chip 200' and provides a predefined duration pulse of light to a particular light activated test connection (e.g., 30b''') to coincide with a timing of a test voltage being applied to the test equipment (e.g., 275b) associated with the particular light activated test connection. In this manner, each test circuit may be turned on and off and tested individually in a sequential scanning operation across the chip 200'.

Figure 18:
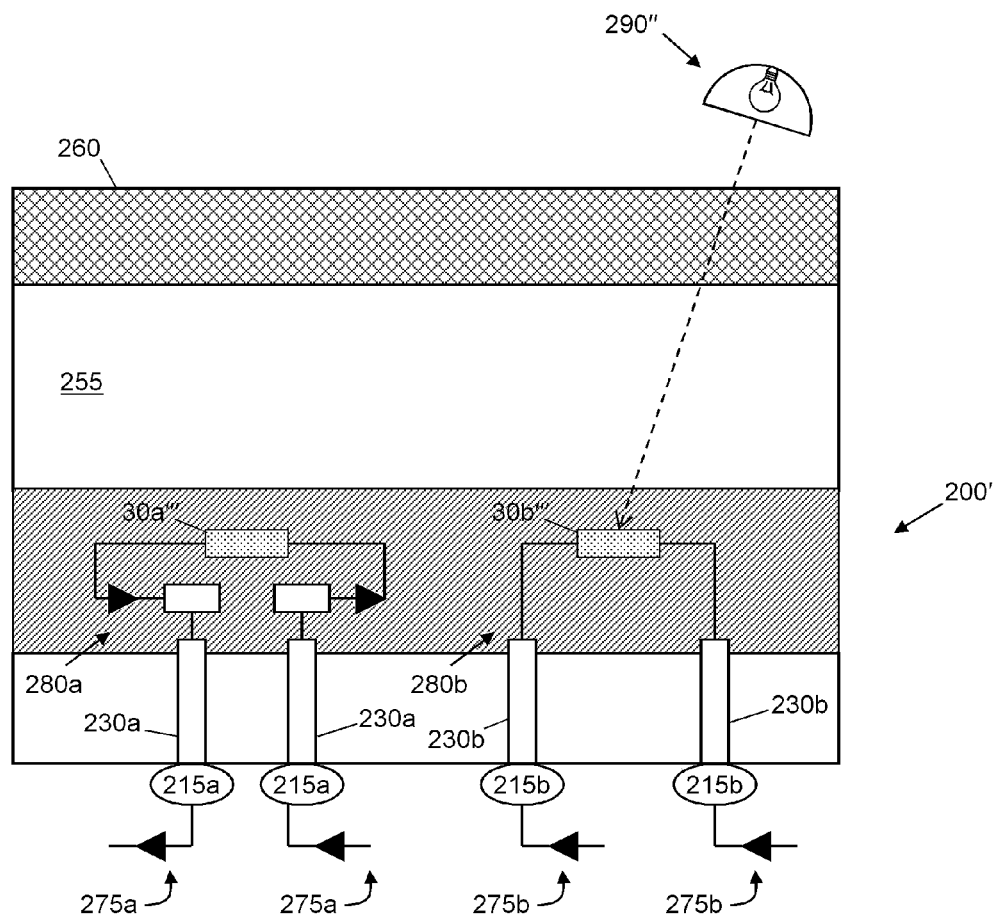
Figure 19:
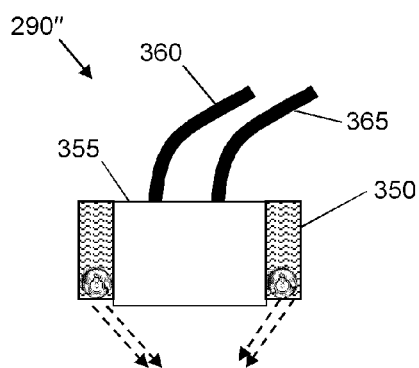
Figure 20:
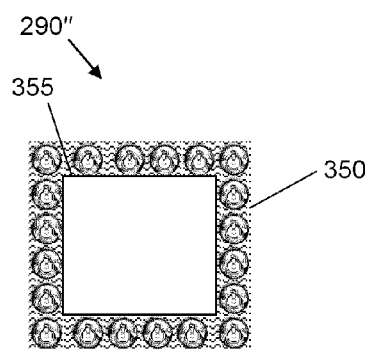

FIG. 18 depicts an arrangement similar to that show in FIG. 17, but with a high power light source 290" with a cooling system. As depicted in FIGS. 19 and 20, the high power light source 290" may include a light ring 350 that surrounds a cooling cell 355. The light ring 350 may comprise a plurality of laser or similar emitters. The cooling cell 355 may comprise a liquid-cooled heat exchanger in physical contact with the light ring 350. The cooling cell 355 may include at least one coolant supply 360 that provides coolant to the heat exchanger, and a coolant return 365 that removes coolant from the heat exchanger. The cooling cell 355 permits using a higher powered light source, which facilitates use with higher power testing of the chip 200'. The high power light source 290" is provided with spatial position and aiming direction control, similar to light source 290'.

Figure 21:
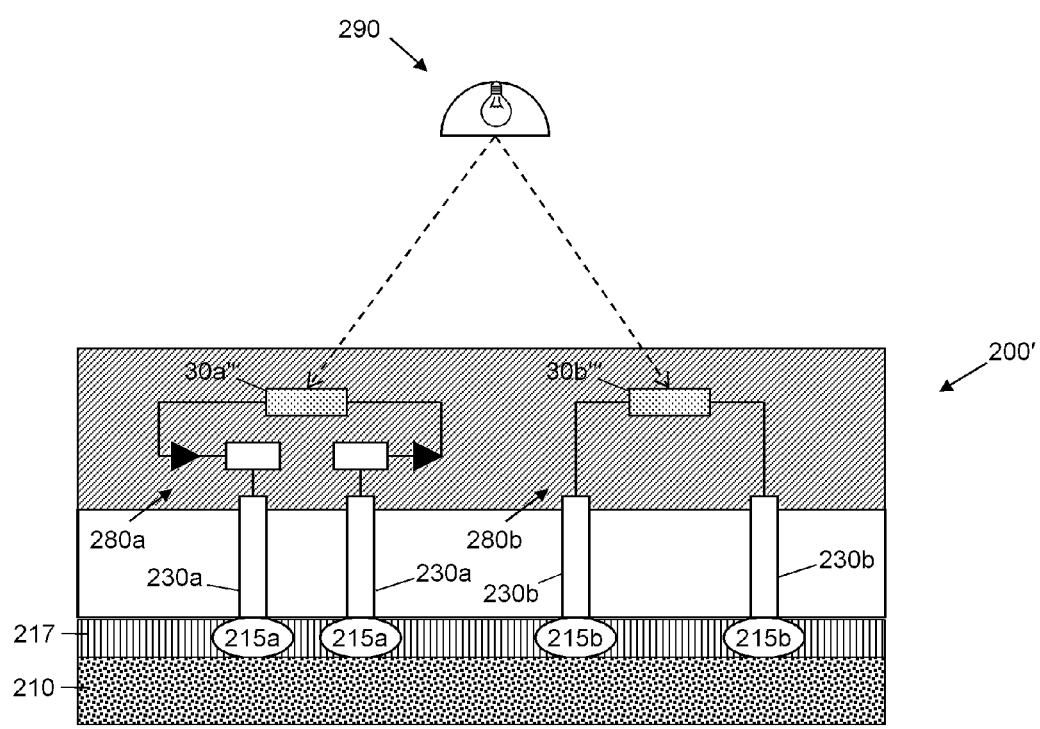
FIGS. 21 and 22 show partial stack test arrangements in accordance with aspects of the invention.

FIG. 21 depicts a partial stack test arrangement according to aspects of the invention in which the chip 200' is connected to a package substrate 210 but is not yet connected to another chip in a 3D chip stack. This arrangement may be used to test the chip 200' later in the manufacturing process compared to the wafer test arrangements depicted in FIGS. 12-20, and may be used to test for defects in the chip 200' that were not detected during the wafer test. As shown in FIG. 21, the chip 200' is diced from the wafer and is connected to the package substrate 210 by the C4 connections 215a and 215b and an underfill material 217. The handler wafer and prober chuck are no longer connected to the chip 200', and a top chip has not yet been connected to the chip 200'.

Still referring to FIG. 21, the light source 290 may be arranged over the chip 200' to provide light for selectively activating the light activated test connections 30a''' and 30b'''. Such testing may be performed bare die in the package socket, e.g., before a package lid has been placed over the chip 200'. A low power light source 290 may be used for testing low power parts.

Figure 22:
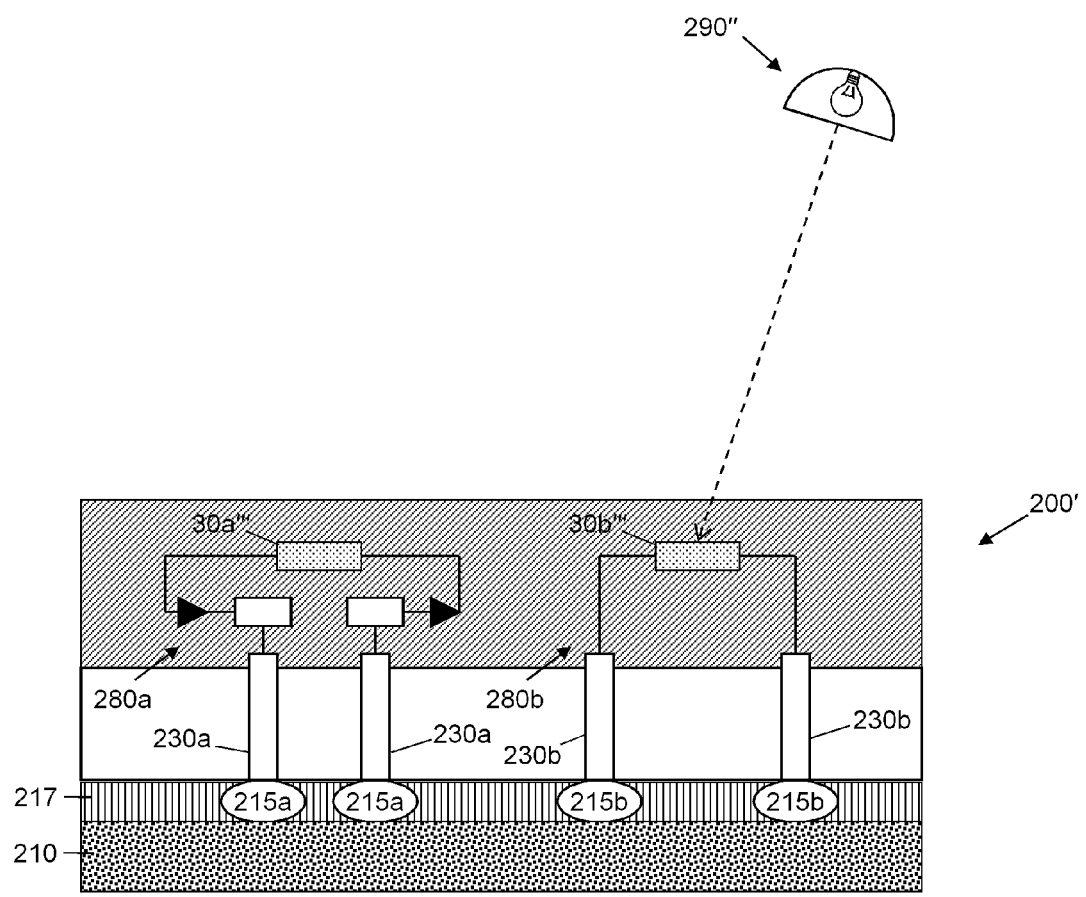

FIG. 22 shows a partial stack test arrangement similar to that of FIG. 21, but with a high power light source 290", which may be similar to the high power light source described with respect to FIGS. 18-20. The high power light source 290" may be provided with cooling and positional control relative to the chip 200' to provide highly selective activation of the light activated test connections 30a''' and 30b''' within the chip 200'. The high power light source 290" may be used with the glass handler wafer attached to prevent damage to the chip 200'.

Figure 23:
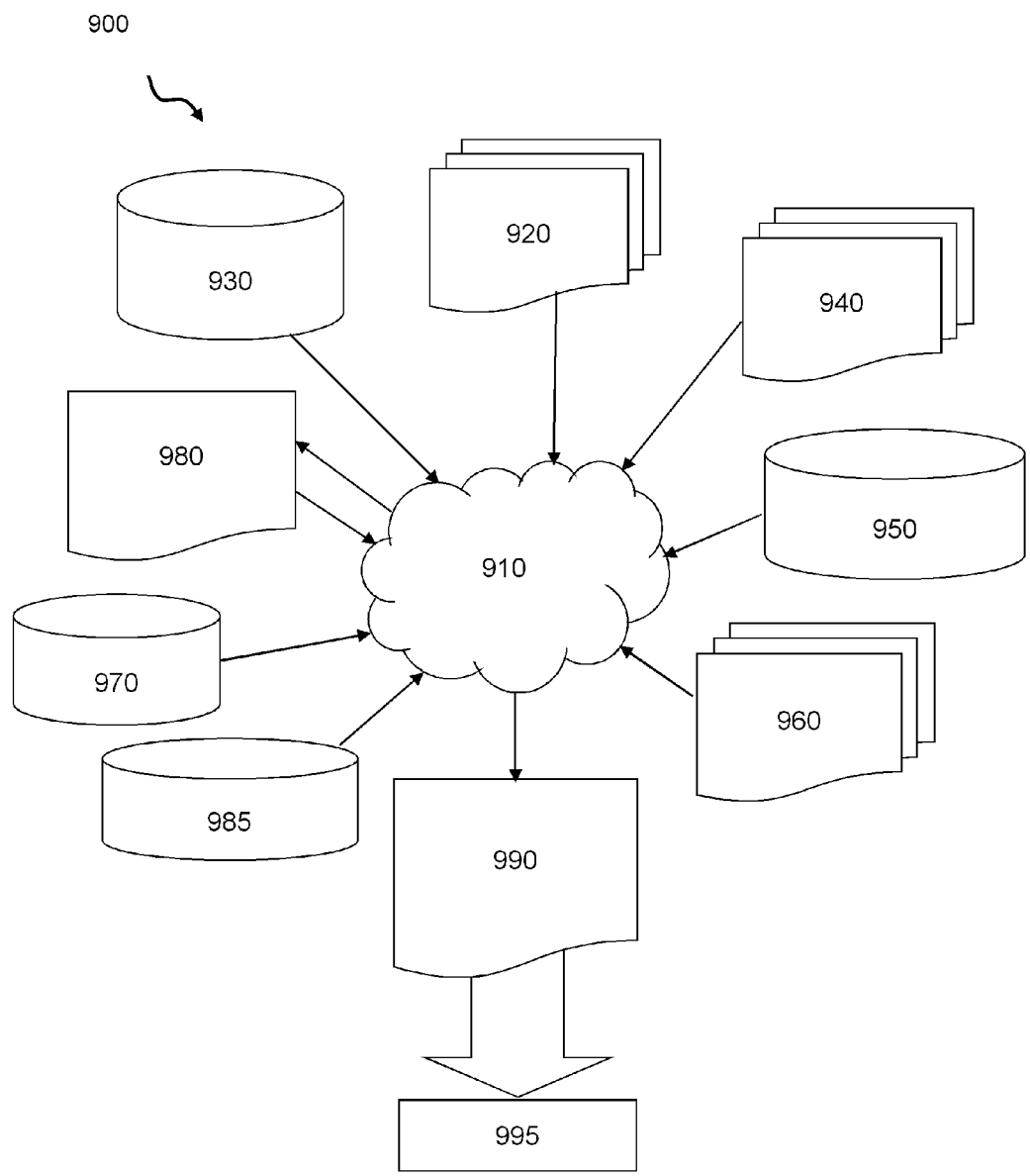
FIG. 23 is a flow diagram of a design process used in semiconductor design, manufacture, and/or test.

FIG. 23 is a flow diagram of a design process used in semiconductor design, manufacture, and/or test. FIG. 23 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-22. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 23 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-22. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-22 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-22. In one embodiment, design structure 990 may comprise a compiled, executable HDL simulation model that functionally simulates the devices shown in FIGS. 1-22.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-22. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure, comprising:
a test circuit comprising a light activated test connection in a semiconductor device, wherein the light activated test connection is electrically conductive during a test of the semiconductor device and is electrically non-conductive after the test,
wherein the semiconductor device is a single chip of a three dimensional stacked chip system; and
the light activated test connection is sacrificial.

2. The structure of claim 1, wherein the light activated test connection is converted from a non-conductive state to a conductive state by applying light.

3. The structure of claim 1, wherein the test circuit is connected between two through silicon vias in the semiconductor device.

4. The structure of claim 3, wherein the light activated test connection is structured and arranged as a switch between the two through silicon vias.

5. The structure of claim 1, wherein:
the semiconductor device contains a silicon-based portion;
the semiconductor device contains one or more silicon based devices; and
the light activated test connection is composed of a material having a bandgap substantially less than that of silicon.

6. The structure of claim 1, wherein the semiconductor device comprises:
an integrated circuit device formed in silicon; and
at least one of an opaque structure and an isolation structure between the integrated circuit device and the light activated test connection.

7. The structure of claim 1, wherein the light activated test connection is arranged to be exposed to light during testing of the semiconductor device but the light activated test connection is covered when inserted into the three dimensional stacked chip system.

8. The structure of claim 1, wherein:
the semiconductor device contains a silicon-based portion;
the semiconductor device contains one or more silicon based devices; and
the light activated test connection is composed of a material having a bandgap substantially greater than that of silicon.

9. The structure of claim 8, wherein:
the bandgap of the material of the light activated test connection is about 1.6 eV;

a light used for activating the light activated test connection is limited in area of exposure.

10. The structure of claim 1, wherein the light activated test connection is on and contacting a barrier layer in the semiconductor device.

11. The structure of claim 1, wherein the test circuit comprises the light activated test connection and a current source connected to a first input of a gate.

12. The structure of claim 11, wherein the test circuit comprises a test control signal connected to a second input of the gate.

13. The structure of claim 12, wherein an output of the gate provides a test control enable signal.

14. A semiconductor structure, comprising:
a test circuit comprising a light activated test connection in a semiconductor device, wherein the light activated test connection is electrically conductive during a test of the semiconductor device and is electrically non-conductive after the test,
wherein the semiconductor device contains a silicon-based portion;
the semiconductor device contains one or more silicon based devices;
the light activated test connection is composed of Ge having a bandgap substantially less than that of silicon and that is between about 0.1 μm and about 1.0 μm thick in a vertical direction of the semiconductor device; and
a light used for activating the light activated test connection has a wavelength of about 1350 nm.

15. A semiconductor structure, comprising:
a test circuit comprising a light activated test connection in a semiconductor device, wherein the light activated test connection is electrically conductive during a test of the semiconductor device and is electrically non-conductive after the test,
wherein the light activated test connection is on and contacting a barrier layer in the semiconductor device; and
wherein the semiconductor device comprises:
the barrier layer;
a first contact pad in a first opening in the barrier layer and contacting a first conductive path; and
a second contact pad in a second opening in the barrier layer and contacting a second conductive path.

16. The structure of claim 15, wherein the light activated test connection comprises a layer of material contacting both the first contact pad and the second contact pad.

17. A semiconductor structure, comprising:
a test circuit comprising a light activated test connection in a semiconductor device, wherein the light activated test connection is electrically conductive during a test of the semiconductor device and is electrically non-conductive after the test;
wherein the test circuit comprises the light activated test connection and a current source connected to a first input of a gate; and
the current source is sized based on a leakage of the light activated test connection and a threshold of the gate.

* * * * *